(12) United States Patent
Huang et al.

(10) Patent No.: US 8,422,231 B2
(45) Date of Patent: Apr. 16, 2013

(54) WATER-COOLED COMMUNICATION CHASSIS

(75) Inventors: Chiu-Mao Huang, Sinjhuang (TW); Chang-Mou Huang, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 111 days.

(21) Appl. No.: 13/178,003

(22) Filed: Jul. 7, 2011

(65) Prior Publication Data

US 2011/0286183 A1  Nov. 24, 2011

Related U.S. Application Data (63) Continuation of application No. 12/485,275, filed on Jun. 16, 2009, now Pat. No. 8,081,463.

(51) Int. Cl.
*H05K 7/20* (2006.01)

(52) U.S. Cl.
USPC ...... 361/709; 361/700; 361/707; 361/679.47; 174/520; 312/223.2

(58) Field of Classification Search .............. 361/679.47, 361/679.52, 700, 702, 704, 709, 710, 717, 361/718, 719
See application file for complete search history.

(56) References Cited

U.S. PATENT DOCUMENTS

| | | | |
|---|---|---|---|
| 5,398,161 A | 3/1995 | Roy | |
| 5,731,954 A | 3/1998 | Cheon | |
| 6,166,907 A | 12/2000 | Chien | |
| 6,418,017 B1 * | 7/2002 | Patel et al. | 361/700 |
| 6,958,910 B2 * | 10/2005 | Tanaka et al. | 361/699 |
| 7,130,193 B2 * | 10/2006 | Hirafuji et al. | 361/700 |
| 7,365,982 B2 | 4/2008 | He | |
| 7,423,875 B2 | 9/2008 | Huang et al. | |
| 7,474,527 B2 * | 1/2009 | Wu | 361/679.48 |
| 7,800,907 B2 * | 9/2010 | Huang et al. | 361/700 |
| 2004/0070949 A1 | 4/2004 | Oikawa et al. | |
| 2005/0141196 A1 * | 6/2005 | Yamatani et al. | 361/699 |
| 2005/0168951 A1 * | 8/2005 | Hirafuji et al. | 361/700 |
| 2005/0243514 A1 * | 11/2005 | Malone et al. | 361/697 |
| 2006/0246952 A1 | 11/2006 | Widmayer et al. | |
| 2010/0208430 A1 * | 8/2010 | Huang et al. | 361/709 |

* cited by examiner

Primary Examiner — Courtney Smith (57) ABSTRACT

A water-cooled communication chassis includes a chassis body and a water cooling unit. The chassis body includes at least one heat receiving portion, at least one heat dissipation portion, and at least one first water pipe system. The first water pipe system has a front part extended through the heat receiving portion and a rear part arranged on the heat dissipation portion, so that heat absorbed by the heat receiving portion is transferred via the first water pipe system to the heat dissipation portion and dissipated therefrom into ambient air. The water cooling unit communicates with the first water pipe system and drives a cooling fluid stored therein to circulate in between the first water pipe system and the water cooling unit, so that the heat absorbed by the heat receiving portion can be quickly and continuously carried away from the communication chassis by the circulating cooling fluid.

5 Claims, 6 Drawing Sheets

WATER-COOLED COMMUNICATION CHASSIS

CROSS REFERENCE TO RELATED APPLICATION

This application is a Continuation of application Ser. No. 12/485,275, filed on Jun. 16, 2009 now U.S. Pat. No. 8,081,463 and entitled "Water-Cooled Communication Chassis", the entire contents of which are hereby incorporated by reference and for which priority is claimed under 35 U.S.C. §120.

FIELD OF THE INVENTION

The present invention relates to a communication chassis, and more particularly to a water-cooled communication chassis that includes a water cooling unit capable of driving a cooling fluid to quickly circulate in between a water pipe system on a chassis body and the water cooling unit, so that the communication chassis has upgraded heat dissipating efficiency.

BACKGROUND OF THE INVENTION

It is known that electronic communication equipment is conventionally enclosed in a communication chassis. When the electronic devices of the communication equipment operate, heat is produced at the same time. The communication chassis is a closed enclosure generally made of a metal material through one-step cast-molding process. However, being limited by the currently available casting techniques, the metal communication chassis usually has relatively low heat conductivity. As a result, heat produced by the electronic devices during operation thereof tends to accumulate in and concentrate at some particular areas of the communication chassis. The accumulated heat results in a relatively high temperature at these areas and cannot be easily dissipated from the closed communication chassis. When the temperature exceeds the range that can be accepted by the electronic devices of the communication equipment, the reliability or service life of the communication equipment is seriously adversely affected. However, for other areas in the communication chassis farther away from the heat-producing electronic devices, the temperature is much lower than that in those areas closer to or contacting with the electronic devices of the communication equipment. That is, the temperature distribution in the conventional communication chassis is extremely uneven to largely reduce an overall heat dissipation performance of the whole communication chassis. The currently available solutions for the above problems generally include enlarging an internal space of the communication chassis and improving the communication chassis material. However, these solutions would inevitably result in a bulky and heavy communication chassis.

It is therefore important to work out a way that can enhance the heat dissipation performance of the communication chassis without increasing its dimensions and weight.

Figure 1:
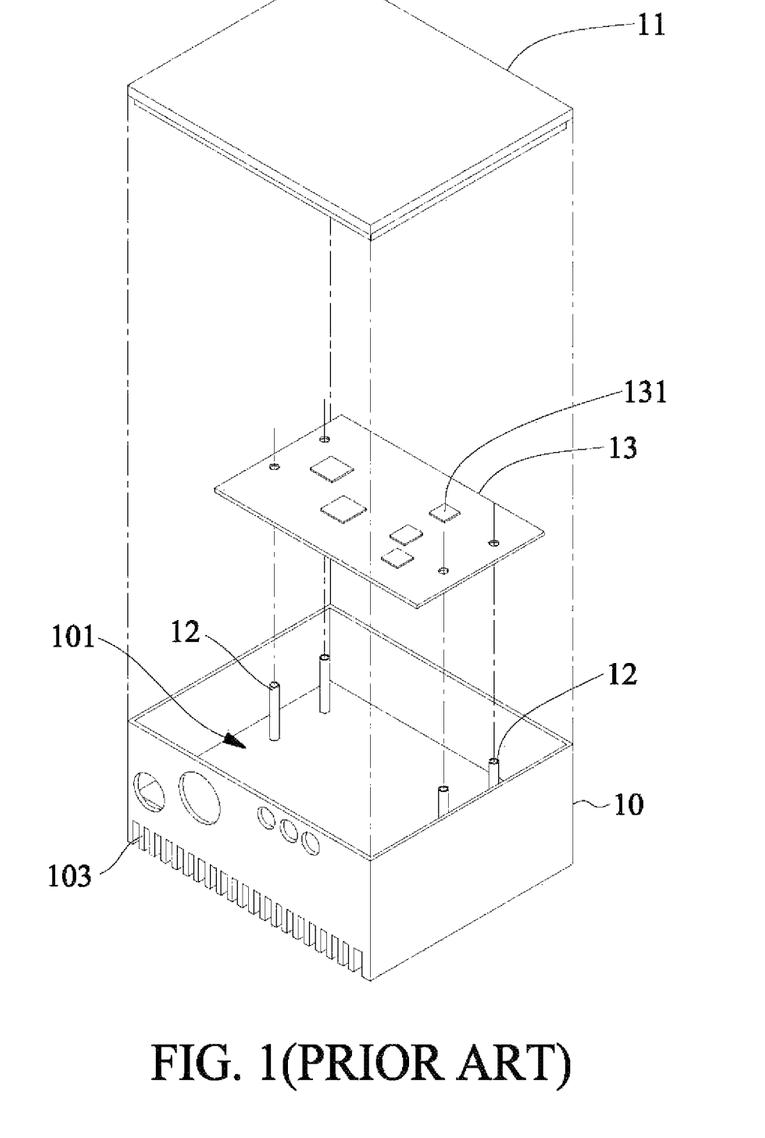
FIG. 1 is an exploded perspective view of a conventional communication chassis.

FIG. 1 is an exploded perspective view of a conventional communication chassis, which includes a chassis body 10, a cover 11, a plurality of supporting posts 12, and a machine board 13. The chassis body 10 defines an inner receiving space 101, and is provided on an outer surface opposite to the receiving space 101 with a plurality of radiating fins 103. The supporting posts 12 are arranged in the receiving space 101 adjacent to one side of the chassis body 10. The machine board 13 has a plurality of heat-producing electronic elements 131 mounted thereon and is connected to and accordingly supported on a top of the supporting posts 12. The cover 11 can be fitted in the receiving space 101 to cover the machine board 13.

The heat-producing elements 131 can include, for example, different chips, a central processing unit (CPU), and other integrated circuits (ICs). When these heat-producing elements 131 on the machine board 13 operate in the communication chassis, a large amount of high-temperature heat is produced. The produced heat is accumulated in the receiving space 101 and could not be quickly dissipated therefrom. The accumulated heat can only be transferred to the chassis body 10 via heat radiation. And only some part of the heat transferred to the chassis body 10 can be radiated from the radiating fins 103 on the chassis body 10 to dissipate outward. Since the heat-producing elements 131 on the machine board 13 are not in contact with any other heat conducting media, such as heat pipes or other heat-conducting elements, the heat produced by the heat-producing elements 131 could not be quickly transferred to the radiating fins 103 for dissipation. As a result, the heat in the communication chassis could not quickly diffuse outward and tends to damage the heat-producing elements 131 and interrupt computing process of the electronic communication equipment, resulting in poor communication signal quality. In some worse conditions, the heat-producing elements 131 would be burned-out or have shortened service life.

According to the above description, the conventional communication chassis has the following disadvantages: (1) having poor heat dissipation effect; (2) easy to cause abnormal operation of the electronic communication equipment; (3) tending to cause poor communication signal quality; (4) tending to shorten the service life of the electronic communication equipment; and (5) having high damage rate.

It is therefore tried by the inventor to develop a water-cooled communication chassis to overcome the problems in the conventional communication chassis.

SUMMARY OF THE INVENTION

A primary object of the present invention is to provide a water-cooled communication chassis that includes a water cooling unit capable of driving a cooling fluid to quickly circulate in between the water cooling unit and a first water pipe system provided on a chassis body of the communication chassis, so that heat produced in the chassis body can be carried away therefrom at upgraded heat dissipating efficiency through the circulating cooling fluid.

Another object of the present invention is to provide a water-cooled communication chassis that ensures stable communication signal quality.

A further object of the present invention is to provide a water-cooled communication chassis that has increased service life.

To achieve the above and other objects, the water-cooled communication chassis according to a preferred embodiment of the present invention includes a chassis body and a water cooling unit. The chassis body includes at least one heat receiving portion, at least one heat dissipation portion, and at least one first water pipe system.

The first water pipe system has a front part extended through the heat receiving portion and a rear part arranged on the heat dissipation portion, so that heat absorbed by the heat receiving portion is transferred via the first water pipe system to the heat dissipation portion and dissipated into ambient air. The water cooling unit communicates with the first water pipe system and drives a cooling fluid stored therein to circulate in between the first water pipe system and the water cooling unit, so that the heat absorbed by the heat receiving portion can be quickly and continuously carried away therefrom by the circulating cooling fluid. Therefore, by providing the water cooling unit and the first water pipe system to circulate the cooling fluid therein, the communication chassis can have excellent heat dissipating performance.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Please refer to FIGS. 2 to 6. A water-cooled communication chassis according to a preferred embodiment of the present invention includes a chassis body 2, at least one water-cooling unit 3, at least one machine board 4, and a cover 6. As can be seen from FIG. 2, which is an exploded perspective view showing the chassis body 2 and the water-cooling unit 3 of the water-cooled communication chassis of the present invention. The chassis body 2 includes at least one heat receiving portion 22, at least one heat dissipation portion 23, and at least one first water pipe system 24. The first water pipe system 24 has a front part extended through the heat receiving portion 22 and a rear part arranged on the heat dissipation portion 23. Heat absorbed by the heat receiving portion 22 is transferred via the first water pipe system 24 to the heat dissipation portion 23 and dissipated into ambient air. The water-cooling unit 3 is communicably connected to the first water pipe system 24, and a cool fluid stored in the water-cooling unit 3 is driven to circulate in between the first water pipe system 24 and the water-cooling unit 3 to remove the heat produced in the communication chassis. The cooling fluid can be water or other suitable liquid coolant.

Figure 2:
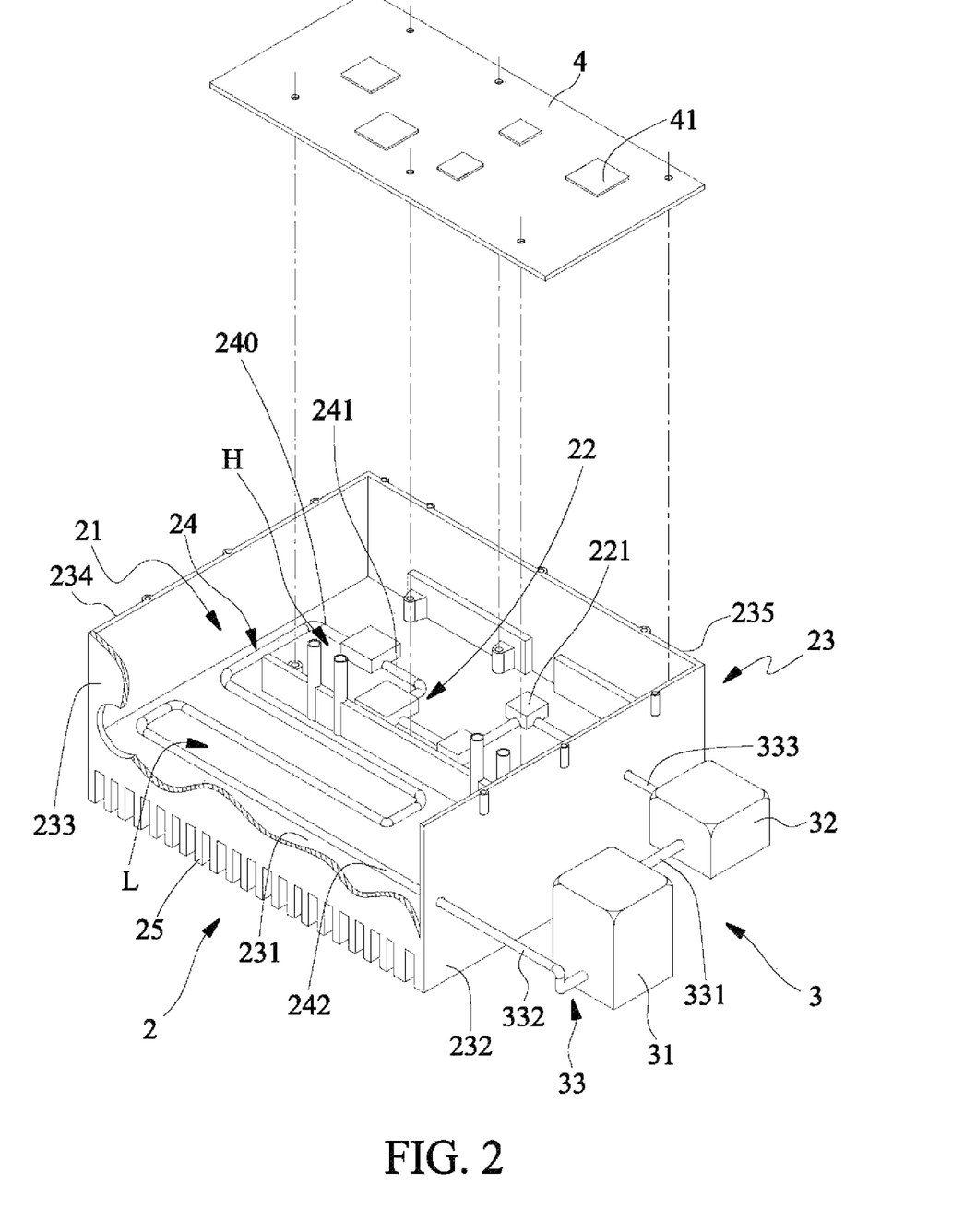
FIG. 2 is an exploded perspective view showing a chassis body and a water-cooling unit of the water-cooled communication chassis according to the present invention.

The chassis body 2 internally defines a receiving space 21 and has a plurality of radiating fins 25 formed on one face of the chassis body 2 opposite to the receiving space 21. In other words, the radiating fins 25 are formed on one outer face of the chassis body 2. The water-cooling unit 3 includes a pump 31, at least one tank 32 for storing the cooling fluid therein, and at least one water guiding pipe line 33. The water guiding pipe line 33 includes a first water guiding pipe 331, a second water guiding pipe 332 and a third water guiding pipe 333. The first water guiding pipe 331 is communicably connected at opposite first and second ends to one end of the pump 31 and the tank 32, respectively. The second and the third water guiding pipe 332, 333 are communicably connected at respective first end to another end of the pump 31 and the tank 32, respectively, and at respective second end to the rear and the front part, respectively, of the first water pipe system 24. The cooling fluid in the tank 32 of the water cooling unit 3 is driven by the pump 31 to flow through the front part of the first water pipe system 24, so that the heat absorbed by the heat receiving portion 22 is carried by the cooling fluid away from the heat receiving portion 22 to the heat dissipation portion 23, on which the rear part of the first water pipe system 24 is arranged. The heat-carrying cooling fluid then flows through the rear part of the first water pipe system 24 and the second end of the second water guiding pipe 332 to flow back to the pump 31 and the tank 32. The heat-carrying cooling fluid flowed back to the pump 31 and the tank 32 is cooled in the tank 32 and then driven to flow through the second end of the third water guiding pipe 333 into the front part of the first water pipe system 24 again. Therefore, the cooling fluid constantly flows to circulate in the first water pipe system 24 and remove the heat absorbed by the heat receiving portion 22 in the chassis body 2, providing the communication chassis with upgraded heat dissipation efficiency to quickly dissipate heat therefrom. More specifically, the first water pipe system 24, the tank 32 and the pump 31 are communicably connected to one another via the first, the second, and the third water guiding pipe 331, 332, 333 to form a circulation loop.

In the heat receiving portion 22, there is provided at least one first raised area 221, which is made of a copper material to possess good heat conducting property or heat absorbing capacity for absorbing heat quickly. The first raised area 221 contacts with at least one heat-producing element 41 aligned therewith, so that a high-temperature zone H is formed at the first raised area 221. That is, when the first raised area 221 absorbs heat produced by the heat-producing element 41, the first raised area 221 becomes a high-temperature heat source area in the receiving space 21 and thereby forms a high-temperature zone H on the chassis body 2.

The first water pipe system 24 includes a plurality of first water pipes 240, each of which includes a first serial-connection section 241 and a first interconnection section 242. The first serial-connection section 241 is sequentially extended through the raised areas 221, and the first interconnection section 242 interconnects the heat dissipation portion 23 with the water cooling unit 3. In other words, a part of the first interconnection section 242 is located in the heat dissipation portion 23 while other parts of the first interconnection section 242 are extended through the chassis body 2 to separately communicably connect to the second ends of the second and the third water guiding pipe 332, 333 of the water cooling unit 3. Therefore, the cooling fluid flowing through the first serial-connection sections 241 and absorbing the heat absorbed by the first raised areas 221 can keep flowing to the first interconnection sections 242 and further to the water cooling unit 3, allowing the cooling fluid to continuously circulate in between the first water pipes 240 of the first water pipe system 24 and the water cooling unit 3. With the above arrangements, a large part of the heat produced in the communication chassis can be removed through the circulation of the cooling fluid stored in the water cooling unit 3, while a remaining small part of the produced heat is transferred to the heat dissipation portion 23 and dissipated into an environment outside the communication chassis.

The heat dissipation portion 23 includes a first heat dissipation section 231, a second heat dissipation section 232, a third heat dissipation section 233, a fourth heat dissipation section 234, and a fifth heat dissipation section 235. These heat dissipation sections 231 to 235 are connected to one another to constitute a low-temperature zone L. The low-temperature zone L is distant from the high-temperature zone H without contacting with any heat-producing element 41, and therefore becomes a heat dissipation area having a relatively low temperature in the receiving space 21. In the illustrated preferred embodiment, the first heat dissipation section 231 is a section on a bottom of the receiving space 21 located opposite to and distant from the heat receiving portion 22. The second to the fifth heat dissipation section 232~235 are sequentially connected to one another to locate around the receiving space 21. In other words, the second heat dissipation section 232 has two opposite lateral edges separately connected to one lateral edge of the third heat dissipation section 233 and the fifth heat dissipation section 235, and the other opposite lateral edge of the third and the fifth heat dissipation section 233, 235 are separately connected to two opposite lateral edges of the fourth heat dissipation section 234.

Moreover, the at least one machine board 4 is held in the receiving space 21, and the at least one heat-producing element 41 is provided on the machine board 4. In the preferred embodiment illustrated in FIG. 4, two machine boards 4 are shown. As can be seen from FIG. 4, there is also at least one support element 213 and at least one heat-conducting element 215 provided in the receiving space 21. The support element 213 is located in the receiving space 21 of the chassis body 2 for supporting the machine boards 4 thereon.

Figure 4:
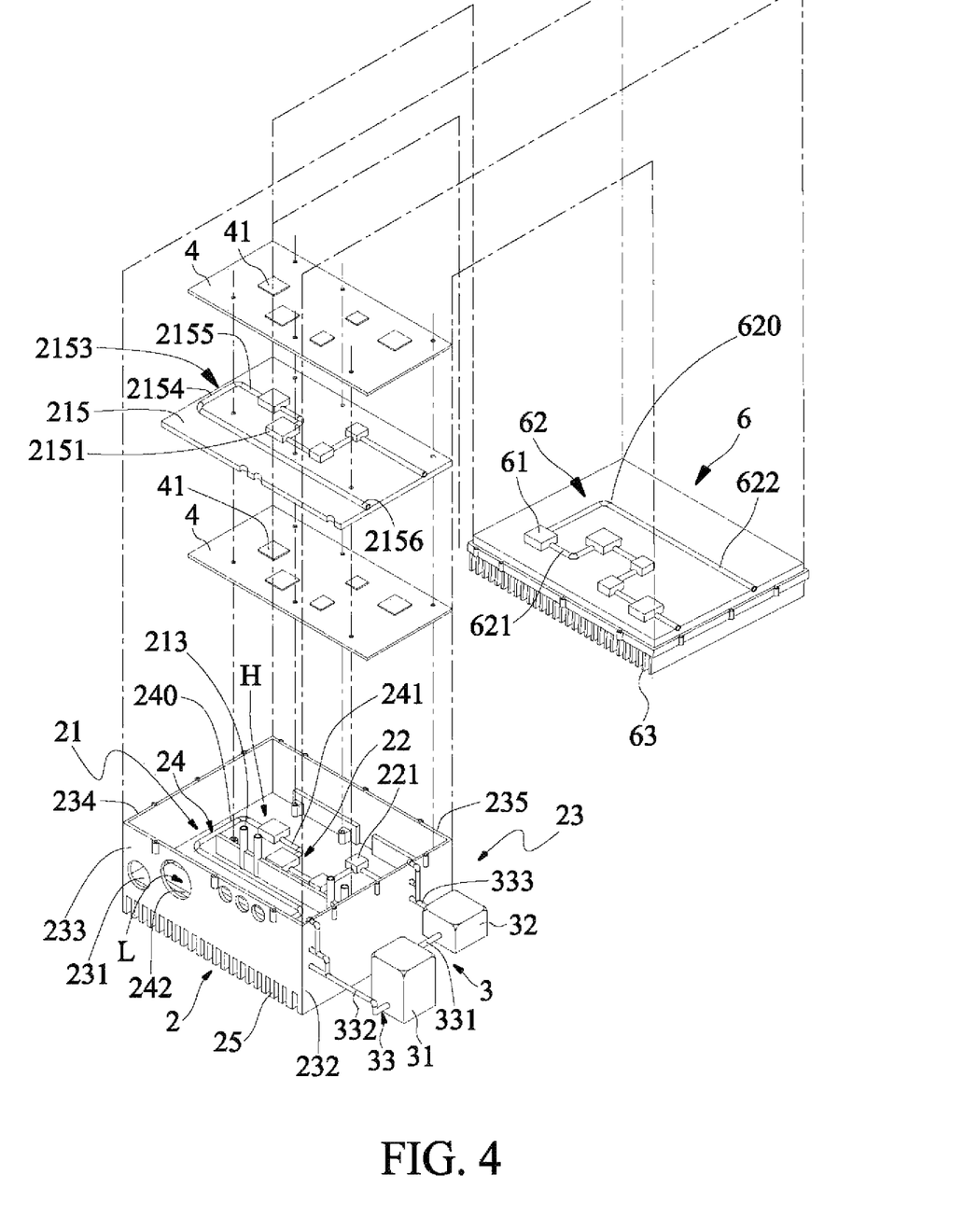
FIG. 4 is an exploded perspective view of the water-cooled communication chassis according to a preferred embodiment of the present invention.

The heat-conducting element 215 is arranged between two adjacent machine boards 4 with one end tightly abutted on an inner surface of the chassis body 2. The heat-conducting element 215 is provided on each of two opposite faces with at least one second raised area 2151 made of a copper material to possess good heat conducting property or heat absorbing capacity. The second raised areas 2151 contact with the heat-producing elements 41 on the two adjacent machine boards 4, so that heat produced by the heat-producing elements 41 on the two machine boards 4 is transferred to and absorbed by the second raised areas 2151, and high-temperature zones H are also formed on the heat-conducting element 215 at the second raised areas 2151.

The heat-conducting element 215 is provided with a second water pipe system 2153, which includes a plurality of second water pipes 2154. Each of the second water pipes 2154 includes a second serial-connection section 2155 that is sequentially extended through the second raised areas 2151, and a second interconnection section 2156 that is extended through the chassis body 2 to connect to the water guiding line 33 of the water cooling unit 3. The cooling fluid flows through the second serial-connection sections 2155 and absorbs the heat absorbed by the second raised areas 2151, and keeps flowing through the second interconnection sections 2156, the second water guiding pipe 332 and the pump 31 back to the tank 32. The heat-carrying cooling fluid flowed back to the tank 32 conducts heat exchange with the cooling fluid stored in the tank 32 to thereby have a lowered temperature and form a fresh cooling fluid again. Then, the fresh cooling fluid is driven by the pump 31 to flow from the tank 32 through the third water guiding pipe 333 into the second water pipes 2154. The large part of the heat produced in the communication chassis can be removed therefrom through the circulation of the cooling fluid in between the second water pipes 2154 and the water cooling unit 3, while the remaining small part of the produced heat is transferred to the heat dissipation portion 23, that is, the first to the fifth heat dissipation sections 231 to 235, and the radiating fins 25 on the outer face of the chassis body 2 via the second interconnection section 2156 to dissipate into the environment outside the communication chassis.

The cover 6 is correspondingly connected to an open side of the chassis body 2. As can be seen from FIGS. 3, 4 and 5, the cover 6 has a first face facing toward the receiving space 21 and an opposite second face facing away from the receiving space 21. The cover 6 is provided on the first face with at least one third raised area 61 and at least one third water pipe system 62, and on the second face with a plurality of radiating fins 63. The third raised area 61 is in contact with the at least one heat-producing element 41 provided on the at least one machine board 4 to absorb heat produced by the heat-producing element 41, so that a high-temperature zone H is formed at the third raised area 61. The third raised area 61 is made of a copper material to possess good heat conducting property or heat absorbing capacity to quickly absorb heat.

Figure 3:
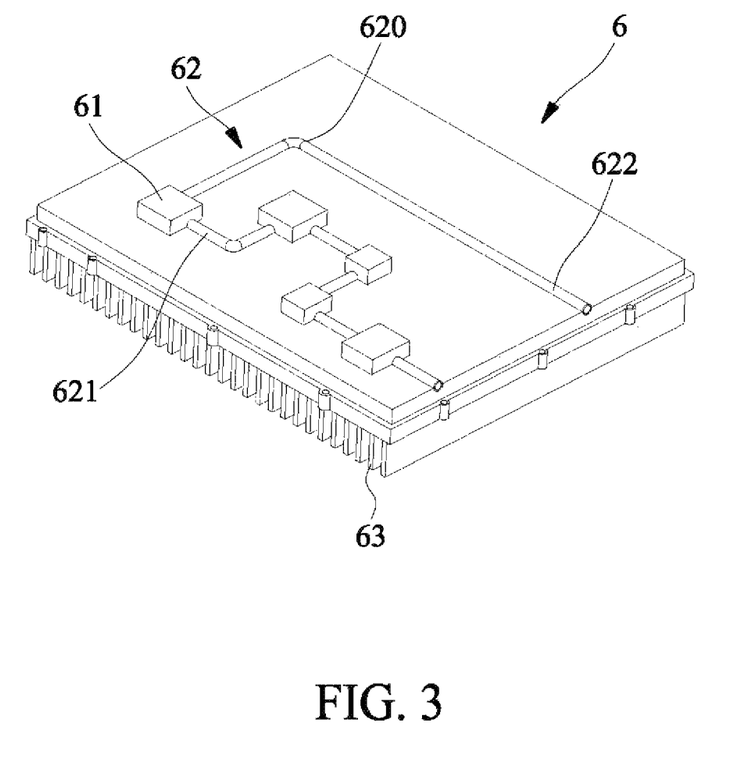
FIG. 3 is an upside-down perspective view of a cover included in the water-cooled communication chassis according to the present invention.

The third water pipe system 62 includes a plurality of third water pipes 620, each of which includes a third serial-connection section 621 that is sequentially extended through the third raised areas 61, and a third interconnection section 622 that is extended through the chassis body 2 to connect to the water cooling unit 3. The cooling fluid flowing in the third serial-connection sections 621 absorbs the heat absorbed by the third raised areas 61, and the heat-carrying cooling fluid keeps flowing to the third interconnection sections 622 and the water cooling unit 3. In other words, the cooling fluid is driven by the pump 31 of the water cooling unit 3 to flow through the third serial-connection sections 621 and thereby absorbs or removes the heat absorbed by the third raised areas 61, which is extended through by the third serial-connection sections 621. The heat-carrying cooling fluid keeps flowing to and through the third interconnection sections 622, the second water guiding pipe 332 and the pump 31 back to the tank 32. The heat-carrying cooling fluid conducts heat exchange with the cooling fluid stored in the tank 32 to thereby form a fresh cooling fluid again. The fresh cooling fluid is driven through the third water guiding pipe 333 into the third water pipes 620 to start another cycle of circulation of the cooling fluid in between the third water pipe system 62 and the water cooling unit 3. Again, a large part of the heat produced in the communication chassis can be removed therefrom through the circulation of the cooling fluid in between the third water pipes 620 and the water cooling unit 3, while the remaining small part of the produced heat is transferred to the heat dissipation portion 23 and the radiating fins 63 on the second face of the cover 6 via the third interconnection section 622 to dissipate into the environment outside the communication chassis.

Figure 5:
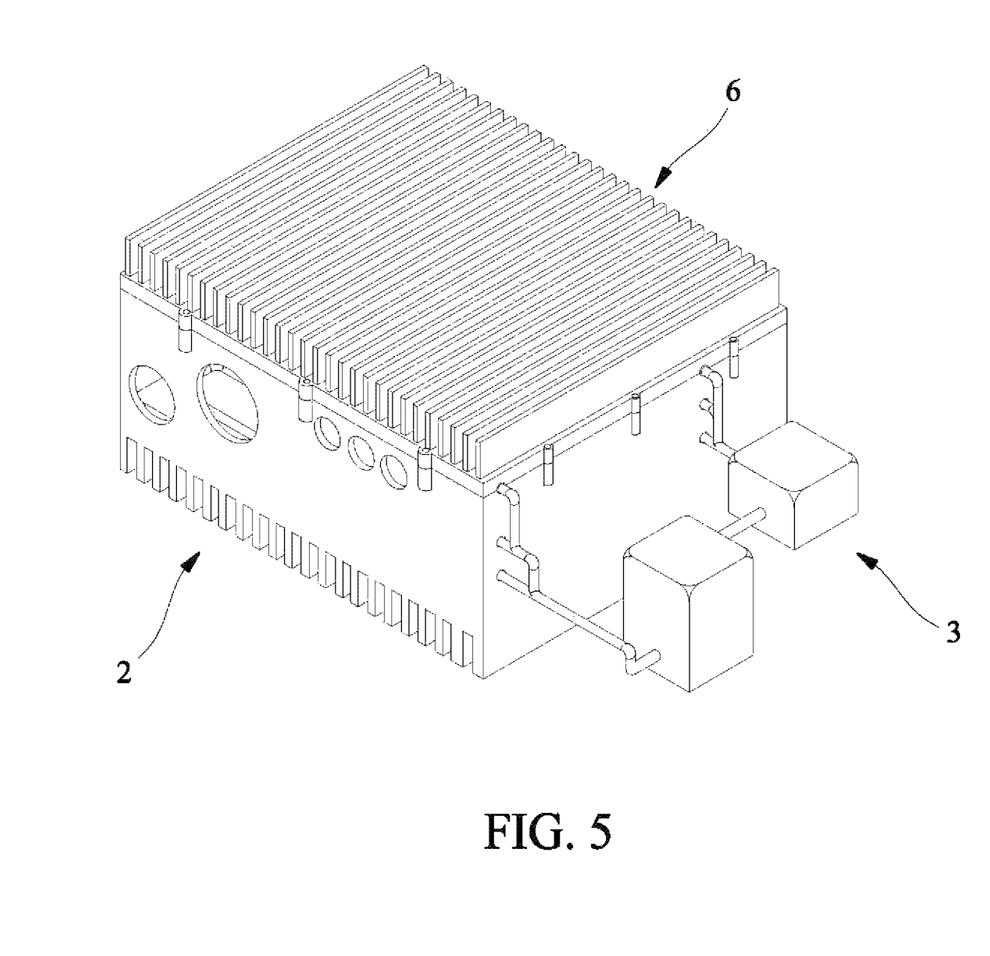
FIG. 5 is an assembled view of FIG. 4.
Figure 6:
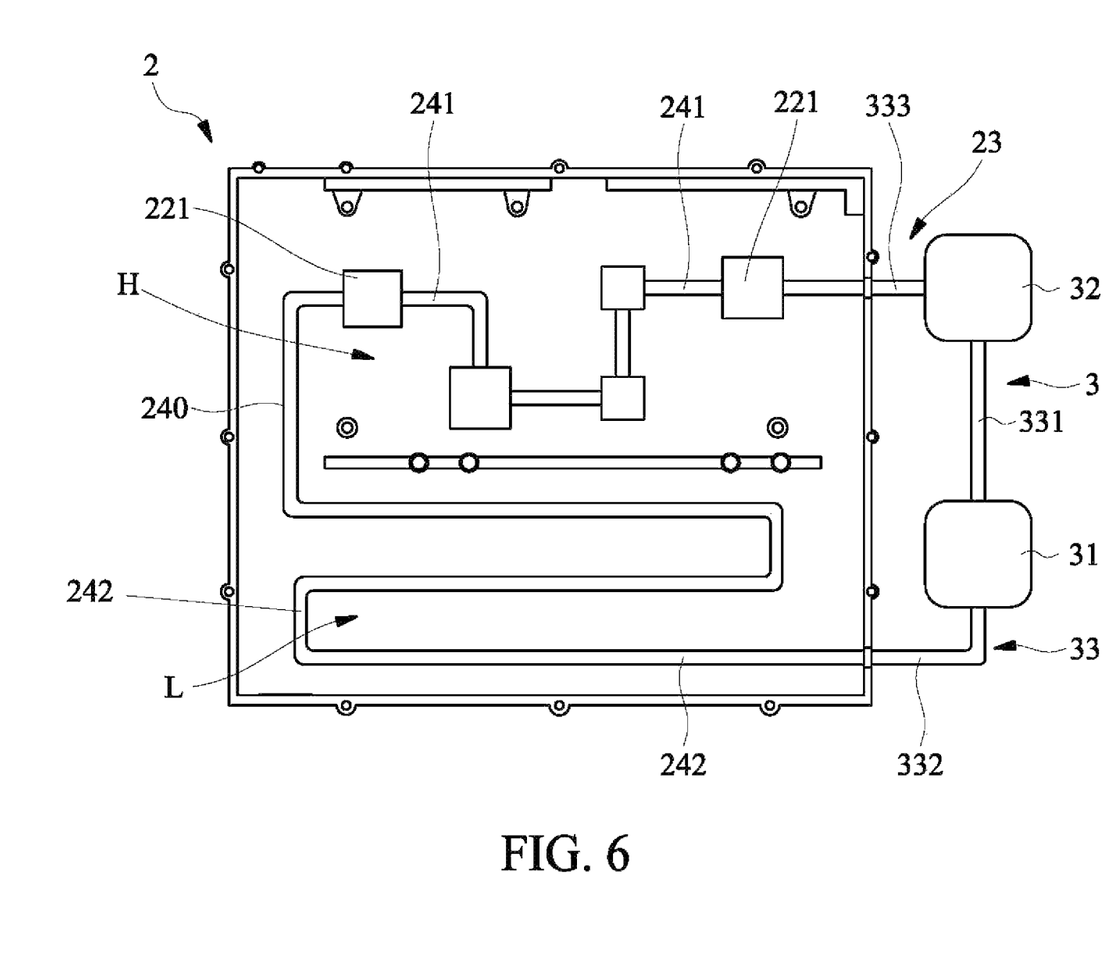
FIG. 6 is a top view of the chassis body and the water-cooling unit of the water-cooled communication chassis according to the preferred embodiment of the present invention.

The function manner of the water-cooled communication chassis according to the preferred embodiment of the present invention will now be described with reference to FIGS. 4, 5, and 6.

During the operation thereof, the heat-producing elements 41 on the two machine boards 4 in the communication chassis will produce a large amount of heat. The first raised areas 221 on the heat receiving portion 22, due to the good heat absorbing capacity thereof, quickly absorb the heat produced by the heat-producing element 41 on the machine boards 4. The heat absorbed by the first raised areas 221 is then absorbed by the cooling fluid flowing through the first serial-connection sections 241 of the first water pipes 240 that extend through the first raised areas 221. The heat-carrying cooling fluid keeps flowing to and through the first interconnection sections 242 and the second water guiding pipe 332 into the pump 31. The pump 31 pressurizes the heat-carrying cooling fluid flowed back thereto, so that the heat-carrying cooling fluid is sent to the tank 32 to form a fresh cooling fluid through heat exchange with the cooling fluid stored in the tank 32. The fresh cooling fluid is further driven through the third water guiding pipe 333 into the first water pipes 240 to start another cycle of circulation. Therefore, fresh cooling fluid can always flow and circulate in between the first water pipes 240 and the water cooling unit 3 to achieve the purpose of heat dissipation through water circulation.

Meanwhile, the second raised areas 2151 on the heat-conducting element 215 and the third raised areas 61 on the cover 6, due to their good heat absorbing capacity, also quickly absorb the heat produced by the heat-producing elements 41 on the machine boards 4. The heat absorbed by the second and third raised areas 2151, 61 is then absorbed by the cooling fluid flowing through the second and third serial-connection sections 2155, 621 of the second and third water pipes 2154, 620, respectively. The heat-carrying cooling fluid keeps flowing to and through the second and third interconnection sections 2156, 622 and the second water guiding pipe 332 into the pump 31. The pump 31 pressurizes the heat-carrying cooling fluid flowed back thereto, so that the heat-carrying cooling fluid is sent to the tank 32 to form a fresh cooling fluid through heat exchange with the cooling fluid stored in the tank 32. The fresh cooling fluid is further driven through the third water guiding pipe 333 into the second and third water pipes 2154, 620 to start another cycle of circulation. Therefore, fresh cooling fluid can always flow and circulate in between the second and third water pipes 2154, 620 and the water cooling unit 3 to achieve the purpose of heat dissipation through water circulation. Further, a small part of the heat produced in the communication chassis is dissipated into ambient air via the heat dissipation portion 23 on the chassis body 2 and the radiating fins 63 on the cover 6. Therefore, with the excellent heat dissipation effect of the chassis body 2 and the cover 6, the temperature inside the chassis body 2 can be efficiently lowered, enabling the machine boards 4 in the communication chassis to operate stably to ensure good communication signal quality.

In brief, the water-cooled communication chassis according to the present invention has the following advantages: (1) having good heat dissipation effect through water circulation; (2) having improved heat dissipation performance; (3) providing stable communication signal quality; and (4) enabling the communication equipment enclosed in the communication chassis to have extended usable life.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A water-cooled communication chassis, comprising:
a chassis body including at least one heat receiving portion, at least one heat dissipation portion, and at least one first water pipe system; wherein the at least one heat dissipation portion has at least one surface; wherein the at least one first water pipe system has a front part extended through the at least one heat receiving portion and a rear part touching the surface of the at least one heat dissipation portion; and wherein heat produced in the chassis body and absorbed by the at least one heat receiving portion is transferred via the at least one first water pipe system to the at least one heat dissipation portion to dissipate therefrom into ambient air;
a water-cooling unit connected to the at least one first water pipe system, and supplying a cool fluid stored therein to circulate in between the at least one first water pipe system and the water-cooling unit to remove heat produced in the chassis body via circulating cooling fluid
wherein the chassis body internally defines a receiving space; and
wherein the heat dissipation portion includes a first, a second, a third, a fourth and a fifth heat dissipation section which are connected to one another to constitute a low-temperature zone; the first heat dissipation section being a section on a bottom of the receiving space located opposite to and distant from the heat receiving portion; and the second to fifth heat dissipation sections being sequentially connected to one another to locate around the receiving space.

2. The water-cooled communication chassis as claimed in claim 1, wherein the heat receiving portion has at least one first raised area provided therein to contact with at least one heat-producing element provided in the chassis body, so that a high-temperature zone is formed at the first raised area.

3. The water-cooled communication chassis as claimed in claim 2, wherein the first water pipe system includes a plurality of first water pipes, each of the first water pipes including a first serial-connection section and a first interconnection section; the first serial-connection sections sequentially extending through the first raised areas, and the first interconnection sections interconnecting the heat dissipation portion with the water cooling unit.

4. The water-cooled communication chassis as claimed in claim 2, wherein the receiving space has at least one machine board held therein, and the at least one heat-producing element is provided on the at least one machine board.

5. The water-cooled communication chassis as claimed in claim 1, wherein the chassis body has a plurality of radiating fins formed on one outer face thereof opposite to the receiving space.

* * * * *